US 6,656,749 B1

(12) United States Patent
Paton et al.

(10) Patent No.: US 6,656,749 B1
(45) Date of Patent: Dec. 2, 2003

(54) IN-SITU MONITORING DURING LASER THERMAL ANNEALING

(75) Inventors: Eric N. Paton, Morgan Hill, CA (US); Robert B. Ogle, San Jose, CA (US); Bin Yu, Cupertino, CA (US); Cyrus E. Tabery, Cupertino, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/013,354

(22) Filed: Dec. 13, 2001

(51) Int. Cl.[7] ............................................. H01L 21/00
(52) U.S. Cl. ................... 438/5; 438/7; 438/10; 438/11; 438/16; 438/18; 438/522; 438/530; 438/540
(58) Field of Search .................. 438/5, 7, 10, 11, 438/522, 530, FOR 150, FOR 154, FOR 408, 16, 12, 540, 541, 550, 18

(56) References Cited

U.S. PATENT DOCUMENTS 4,155,779 A  * 5/1979 Auston et al. ................. 438/7

* cited by examiner

Primary Examiner—George Fourson
Assistant Examiner—Julio J. Maldonado

(57) ABSTRACT

A method of manufacturing a semiconductor device includes thermal annealing source/drain regions with a laser, measuring a depth of the source/drain regions, and adjusting a parameter of the laser used in the thermal annealing process. After the laser is adjusted, the source/drain regions are laser thermal annealed again until a desired depth of the source/drain regions is obtained. An apparatus for processing a semiconductor device includes a chamber, a laser, a measuring device, and a controller. The semiconductor device is positioned within the chamber for processing. The laser is used to laser thermal anneal the semiconductor device within the chamber. The measuring device measures a depth of source/drain regions in the semiconductor device when the semiconductor device is within the chamber, and the controller receives measurement information from the measuring device and adjusts parameters of the laser.

11 Claims, 7 Drawing Sheets

US 6,656,749 B1

IN-SITU MONITORING DURING LASER THERMAL ANNEALING

FIELD OF THE INVENTION

The present invention relates to the manufacturing of semiconductor devices, and more particularly, to laser anneal processes that minimize overmelt of source/drain regions.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS semiconductor device includes a semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

MOS devices typically fall in one of two groups depending on the type of dopants used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

A type of device, commonly referred to as a MOS field-effect-transistor (MOSFET), includes a channel region formed in the semiconductor substrate beneath the gate area or electrode and between the source and drain regions. The channel is typically lightly doped with a dopant having a conductivity type opposite to that of the source/drain regions. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner an electric field is used to control the current flow through the channel region.

The semiconductor industry is continually striving to improve the performance of MOSFET devices. The ability to create devices with sub-micron features has allowed significant performance increases, for example, from decreasing performance degrading resistances and parasitic capacitances. The attainment of sub-micron features has been accomplished via advances in several semiconductor fabrication disciplines. For example, the development of more sophisticated exposure cameras in photolithography, as well as the use of more sensitive photoresist materials, have allowed sub-micron features, in photoresist layers, to be routinely achieved. Additionally, the development of more advanced dry etching tools and processes have allowed the sub-micron images in photoresist layers to be successfully transferred to underlying materials used in MOSFET structures.

As the distance between the source region and the drain region of the MOSFET (i.e., the physical channel length) decreases, in the effort to increase circuit speed and complexity, the junction depth of source/drain regions must also be reduced to prevent unwanted source/drain-to-substrate junction capacitance. However, obtaining these smaller junction depths tests the capabilities of current processing techniques, such as ion implantation with activation annealing using rapid thermal annealing. Rapid thermal annealing typically involves heating the silicon wafer, after implanting, under high-intensity heat lamps. Implanting or doping usually amorphizes the silicon substrate, and the activation annealing is used to recrystallize the amorphized silicon region.

As a result of the limitations of rapid thermal annealing, laser thermal annealing is being implemented, particularly for ultra-shallow junction depths. Laser thermal annealing may be performed after ion implantation of a dopant and involves heating the doped area with a laser. The laser radiation rapidly heats the exposed silicon such that the silicon begins to melt. The diffusivity of dopants into molten silicon is about eight orders of magnitude higher than in solid silicon. Thus, the dopants distribute almost uniformly in the molten silicon and the diffusion stops almost exactly at the liquid/solid interface. The heating of the silicon is followed by a rapid quench to solidify the silicon, and this process allows for non-equilibrium dopant activation in which the concentration of dopants within the silicon is above the solid solubility limit of silicon. Advantageously, this process allows for ultra-shallow source/drain regions that have an electrical resistance about one-tenth the resistance obtainable by conventional rapid thermal annealing.

A problem associated with forming source/drain regions using laser thermal annealing is controlling the energy. Although amorphous silicon absorbs energy at a higher rate than crystalline silicon, and therefore, the fluence of the laser can adjusted to melt only to a depth that the silicon has been amorphized, the fluence must be initially set. If the setting is too low, the dopant does not fully activate in the source/drain regions, and if the setting for fluence is too high, overmelt into the substrate can occur. Furthermore, process conditions may change over time and cause the required fluence of the laser to also change. Accordingly, a need exists for an improved laser anneal process that allows for real-time adjustment of the fluence of the laser to provide a more precise control of the melting depth and to reduce the incidence of overmelting.

SUMMARY OF THE INVENTION

This and other needs are met by embodiments of the present invention which provide a method of manufacturing a semiconductor device. The method includes thermal annealing source/drain regions with a laser, measuring a depth of the source/drain regions, and adjusting at least one parameter of the laser used in the thermal annealing process. After the laser is adjusted, the source/drain regions are laser thermal annealed again, and the process is repeated until a desired depth of the source/drain regions is obtained.

By measuring the depth of the source/drain regions immediately after laser thermal annealing and adjusting the laser thermal anneal process, a lower initial fluence can be used during the laser thermal annealing process. In so doing, the likelihood of overmelt of the source/drain regions into the substrate can be reduced. Also, the depth of the source/drain regions can be more finely controlled.

In a further aspect of the present invention, the parameters to be adjusted include an energy fluence of a laser pulse of the laser, which can vary depending upon factors such as wattage of the laser, the length of the laser pulse, and the number of laser pulses. Also, the measuring of the depth of the source/drain regions can occur when the source/drain regions are melted or when the source/drain regions are recrystallized. The depth to be measured can be the depth of the melted source/drain regions, the depth of the activated source/drain regions, or the depth of the recrystallized source/drain regions.

In another embodiment of the present invention, an apparatus for processing a semiconductor device is provided. The apparatus includes a chamber, a laser, a measuring device, and a controller. The semiconductor device is positioned within the chamber for processing. The laser is used to laser thermal anneal the semiconductor device within the chamber. The measuring device measures a depth of source/drain regions in the semiconductor device when the semiconductor device is within the chamber, and the controller receives measurement information from the measuring device and adjusts parameters of the laser.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves, at least in part, the problem of overmelting of source/drain regions into a semiconductor substrate during laser thermal annealing to activate the source/drain regions. This is achieved, in part, by using feedback provided by measurement of the source/drain region to adjust parameters of the laser used in the laser thermal annealing. Because multiple laser pulses can be used, the laser pulses can initially have a low energy fluence, which increases during subsequent pulses. The steps of adjusting parameters, laser annealing, and measuring is repeated until the source/drain regions have achieved a desired depth. Because the effects of each laser pulse is monitored, the fluence used during the laser thermal annealing process does not reach a high enough level to cause overmelting.

An embodiment of the present invention is illustrated in FIGS. 1A–1F. A silicon substrate is provided and can be formed from any material suitable for integrated circuit manufacture. However, in one aspect, the substrate is formed from single-crystal silicon, with a <100> crystallographic orientation and which has been slightly doped with n-type or p-type impurities. Separate MOS devices are separated on the silicon substrate using isolation structures, such as a field oxide or a shallow isolation trench (not shown).

A shallow isolation trench, for example, can be formed by etching either isotropically with wet techniques or anisotropically with dry etch techniques. An oxide is thereafter deposited within the trench. As an alternative to the shallow isolation trench, a field oxide can be formed. A field oxide is typically formed via thermal oxidation in an oxygen-steam ambient at temperatures from about 850 to 1050° C. A patterned, oxidation-resistant mask can be used to prevent oxidation of non-isolation device regions. After formation of the field oxide, the mask is removed using known techniques, for example hot phosphoric acid for a silicon nitride mask or buffered hydrofluoric acid for a pad oxide mask.

Figure 1A:
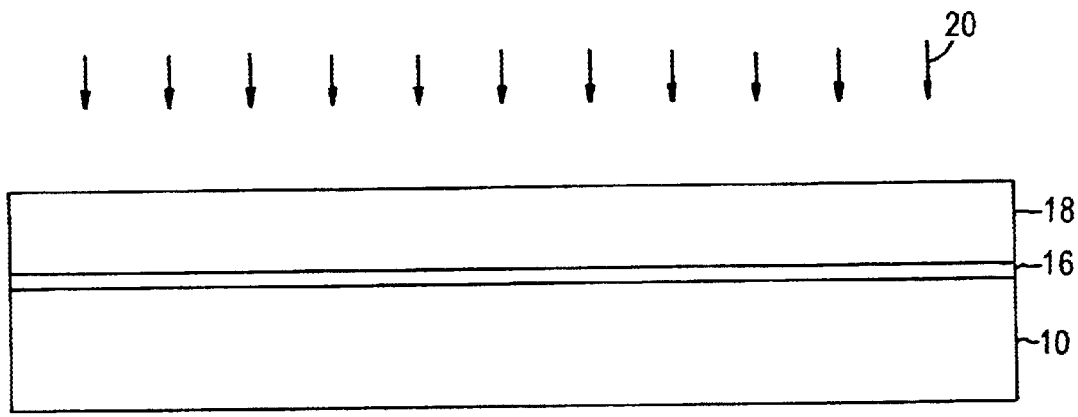
FIGS. 1A–1F schematically illustrate sequential phases of a MOS fabrication method using a laser thermal annealing process in conjunction with solid phase epitaxy according to an embodiment of the present invention.

In FIG. 1A, a gate oxide 16, comprised of silicon dioxide, is formed on the top surface of the substrate 10, for example, using thermal oxidation at temperatures from about 700 to 1000° C. in an oxygen-steam ambient. Although not limited in this manner, the gate oxide 16 can have a thickness from about 30 to 200 angstroms. After deposition of the gate oxide 16, a gate electrode is formed over the gate oxide 16.

The formation of a gate electrode typically involves depositing a blanket layer of undoped polysilicon 18, for example by low pressure chemical vapor deposition (LPCVD) at temperatures from about 600 to 800° C., on the top surface of gate oxide 16. Although not limited in this manner, the polysilicon layer 18 can have a thickness from about 500 to 5000 angstroms. The polysilicon layer 18 can then be implanted with nitrogen ions, as depicted by arrows 20. The implanted nitrogen ions, for example, can be used to retard the diffusion of boron atoms. The implantation of the nitrogen ions can be at a dosage from about $5\times10^{14}$ to $5\times10^{15}$ dopants/cm$^2$ and at an energy level from about 20 to 200 keV.

Figure 1B:
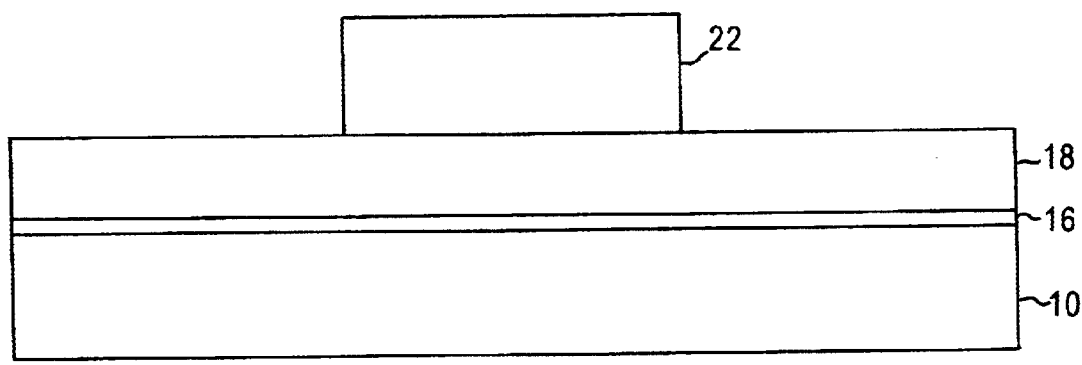

In FIG. 1B, the layers over the gate oxide 16 are etched to form the gate electrode. The etching of the gate typically involves forming a photoresist 22 on the polysilicon layer 18, and the photoresist 22 is selectively irradiated using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the polysilicon layer 18, which will thereby define the gate electrode.

Figure 1C:
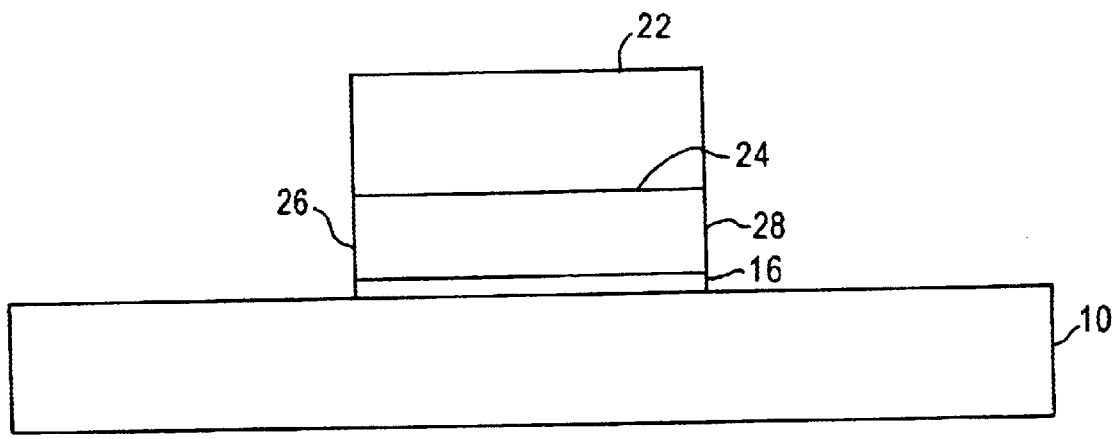

In FIG. 1C, an etch, typically anisotropic, is applied to remove the exposed portions of the polysilicon layer 18 and the underlying portions of the gate oxide 16. After etching, the remaining portion of the polysilicon layer 18 provides a gate electrode 24 having opposing vertical sidewalls 26, 28. Although not limited in this manner, the width of the gate electrode 24 between the sidewalls 26, 28 can be from about 500 to 2500 angstroms.

Figure 1D:
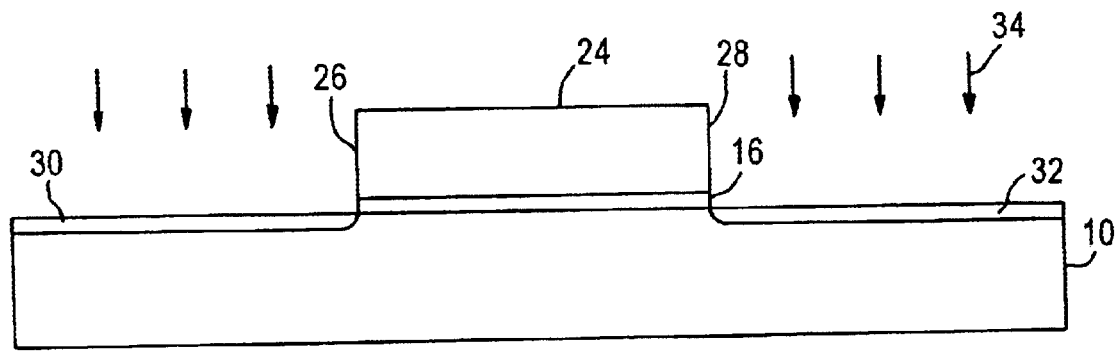

In FIG. 1D, the photoresist 22 is stripped, and lightly doped (LDD) source/drain extensions 30, 32 are formed by an ion implantation, as represented by arrows 34. The ion implantation may be an n-type dopant, such as arsenic or phosphorus, if an NMOSFET is desired, or a p-type dopant, such as boron, if a PMOSFET is desired. Illustrative examples of implant energies and dosages for doping respectively range from about 2 to 20 keV and from about $5\times10^{14}$ to $3\times10^{15}$ dopants/cm$^2$. The source/drain extensions 30, 32 are formed within the substrate 10 immediately adjacent to the sidewalls 26, 28 and are self-aligned with the gate electrode 24. After implantation, annealing is conducted to activate the source/drain extensions 30, 32 and to recrystallize the extensions. Alternatively, the annealing can occur after formation of the source/drain regions. Typically, the source/drain extensions 30, 32 extend down from the surface of the silicon substrate 10 to a depth of about 50 angstroms to 300 angstroms.

Figure 1E:
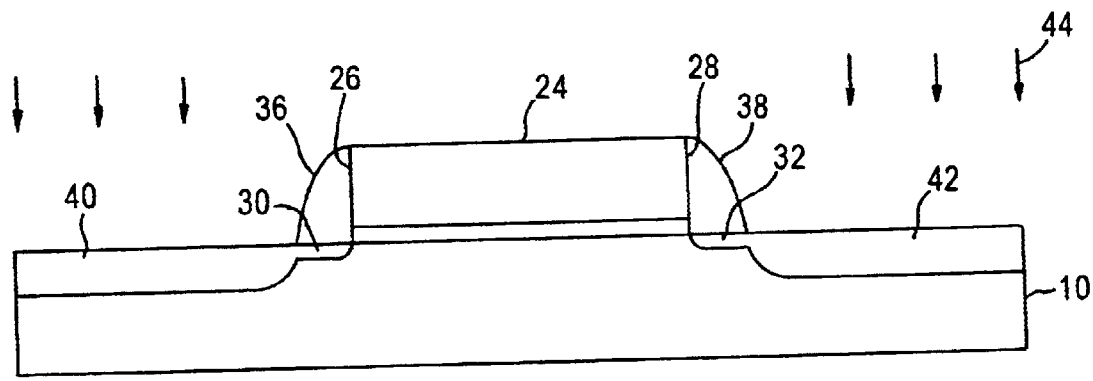

In FIG. 1E, sidewall spacers 36, 38 are formed following the implantation of the source/drain extensions 30, 32. Formation of the sidewall spacers 36, 38 involves blanket depositing a spacer material over the substrate 10. The spacer material can be silicon nitride or some other material such as plasma-enhanced oxide (PEOX) or tetraethoxysilane (TEOS) oxide. The blanket deposition is followed by an anisotropic etch, which removes the spacer material except for the sidewall spacers 36, 38 immediately adjacent to the sidewalls 26, 28 of the gate electrode 24 and over the substrate 10.

After formation of the sidewall spacers 36, 38, heavily doped (HDD) or moderately doped (MDD) source/drain regions 40, 42 are formed by a second ion implantation, as represented by arrows 44. The source/drain regions 40, 42 are formed within the substrate 10 and extend past the source/drain extensions 30, 32 immediately adjacent to the sidewall spacers 36, 38. The sidewall spacers 36, 38 act as masks, which protect portions of the source/drain extensions 30, 32 from being heavily doped. Illustrative examples of implant energies and dosages for doping respectively range from about 0.5 keV to 60 keV and from about $1\times10^{14}$ to $5\times10^{15}$ dopants/cm$^2$. In one aspect of the invention, the source/drain regions 40, 42 can also be amorphized, and an example method of amorphizing the substrate 10 involves doping the substrate with an inert atom, such as Si, Ge, or a noble ion. Illustrative examples of implant energies and dosages for doping respectively range from about 30 keV to 130 keV and from about $5\times10^{13}$ to $5\times10^{14}$ dopants/cm$^2$. The implanting of the source/drain regions 40, 42 with an inert atoms amorphizes the silicon, which must then be recrystallized to activate the source/drain regions 40, 42.

Figure 1F:
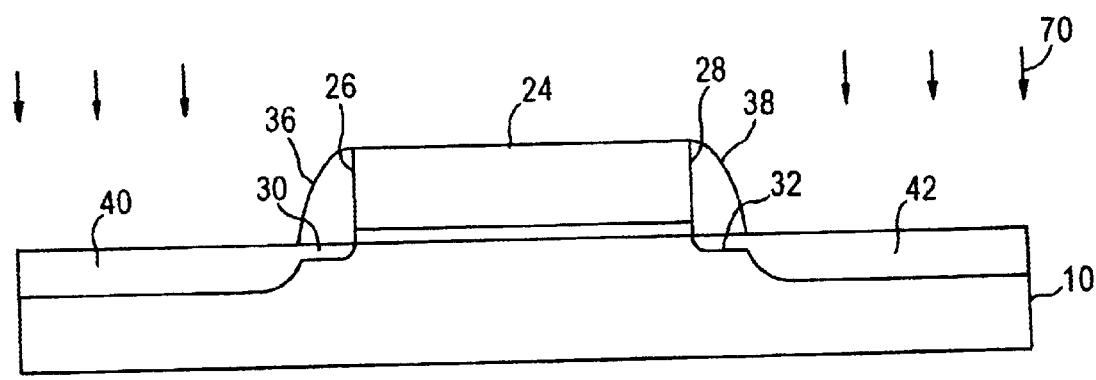

In FIG. 1F, after implantation of the source/drain regions 40, 42, the source/drain regions 40, 42 are activated using a laser thermal annealing process. The energy from the laser, represented by arrows 70, is applied to liquefy the substrate 10. After the silicon in source/drain regions 40, 42 has been melted, which takes approximately 30–100 nanoseconds, the silicon will cool rapidly, within about one microsecond, and the silicon will reform epitaxially. In so doing, damage caused by the implant process all will be removed.

The energy fluence of the laser at the surface determines the melt duration that occurs at the surface, and melt duration is related to maximum melt or junction depth. The relationship between melt duration and maximum melt depth depends on the temporal profile of the laser beam. In a current aspect of the invention, control of junction depth is accomplished by an in-line measurement of the junction depth using conventional methods, followed by an adjustment, if necessary, of process parameters of the laser. The process parameters to be varied include energy fluence, and energy fluence can be modified by adjusting the power or wattage of the pulses (FIG. 2A), the number of pulses of the laser, and/or the length of the pulses (FIG. 2B). For example, a fluence range of approximately 100 mJ/cm$^2$ to 750 mJ/cm$^2$ results in junction depths ranging from 200 angstroms to 1500 angstroms from a 308 nm excimer laser at a 9 Hz repetition rate.

Figure 2A:
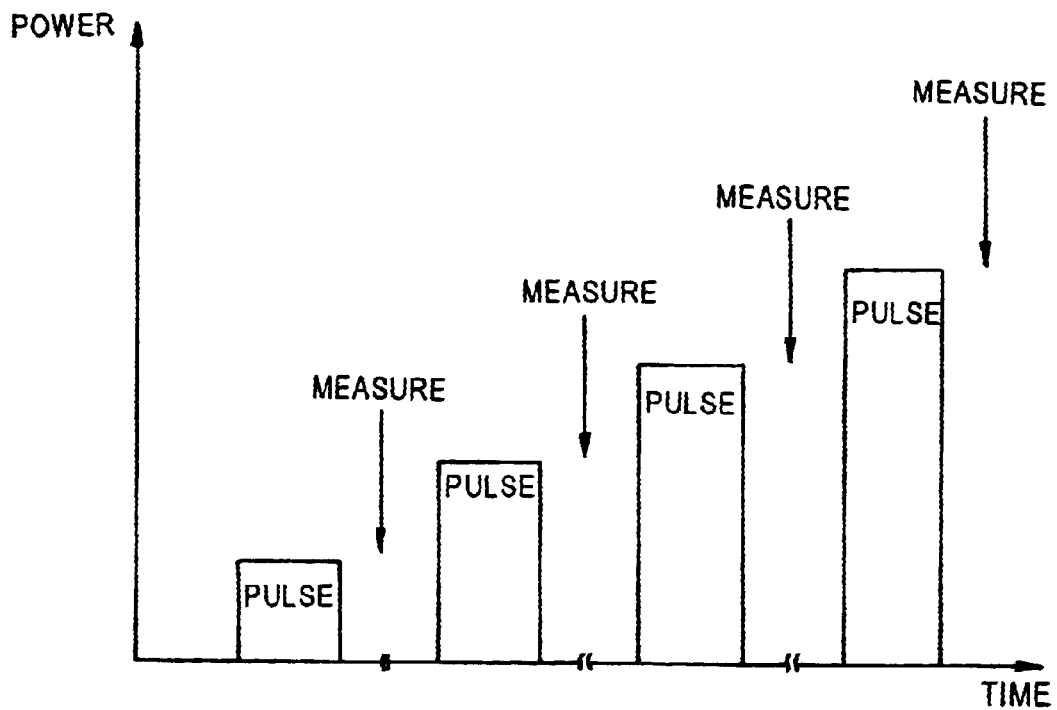
FIG. 2A graphically illustrates the power of a laser pulse being adjusted over time to increase the fluence of the laser pulse.
Figure 2B:
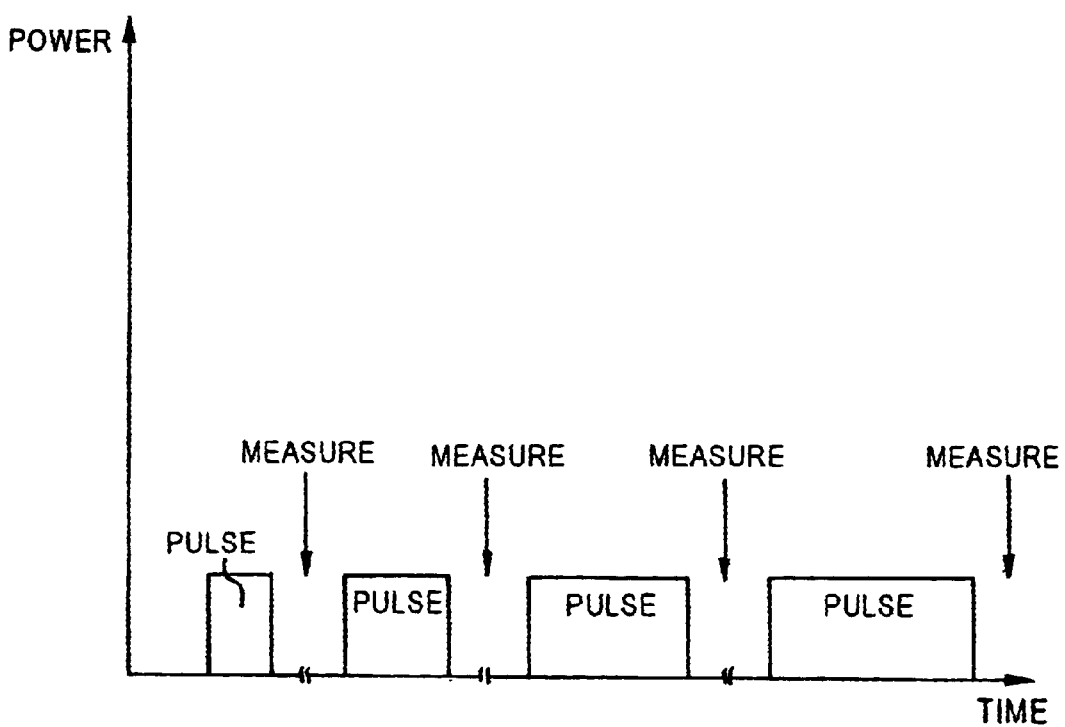
FIG. 2B graphically illustrates the length of a laser pulse being adjusted over time to increase the fluence of the laser pulse.
Figure 3:
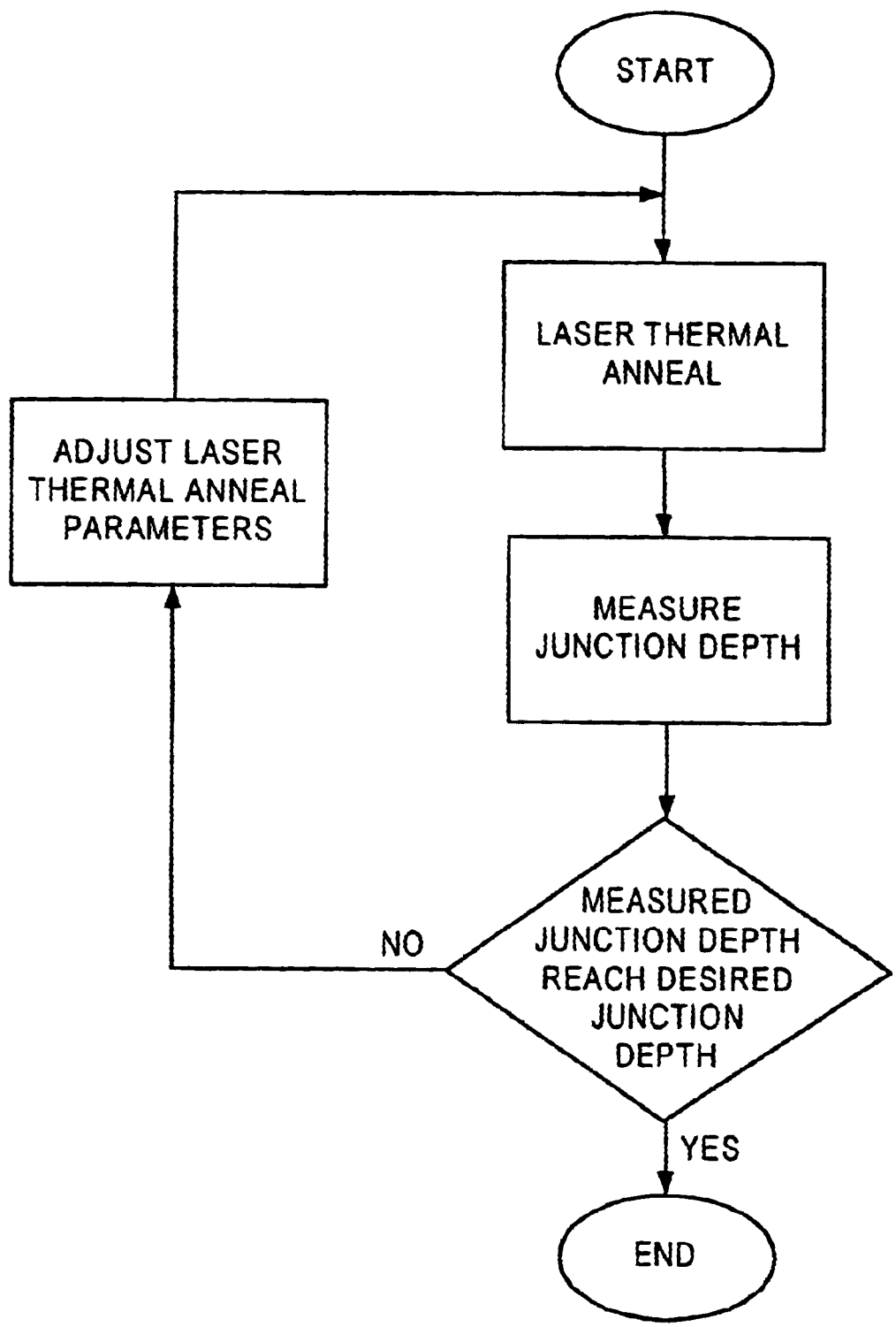
FIG. 3 is a flow chart of a method for laser thermal annealing according to an embodiment of the present invention.

As illustrated in FIGS. 2A–2B and FIG. 3, the process sequence of adjusting the laser; exposing the source/drain regions 40, 42 to the laser; and measuring the junction depth is repeated until the junction depth reaches a desired depth. Typically, the source/drain regions 40, 42 extend down from the surface of the silicon substrate 10 to a final depth of about 400 angstroms to about 1000 angstroms, although ultra-shallow junctions can have depths of only 100 angstroms to about 200 angstroms.

An example of a laser capable of providing this energy is a spatially homogenized 308 nm XeCl pulsed laser, although the invention is not limited in this manner. Also, the energy and power of the laser can vary in accordance with different applications. For example, the fluence range for laser irradiation can extend from about 50 mJ/cm$^2$ to about 1.3 J/cm$^2$.

Many different methods can be used to determine the depth of the source/drain regions 40, 42, and the invention is not limited as to a particular method. One method of detecting the depth of the source/drain region, known as carrier illumination, involves the use of a low power laser to excite carriers in the active silicon. A second laser is then used to illuminate the surface, and through the use of interferometry, the difference in index of refraction between silicon with excited carriers and silicon with non-excited carriers can be determined. From the difference in index of refraction, a measurement as to the depth of the activated source/drain regions 40, 42 can be made.

Another method that can be used to determine the depth of the source/drain regions 40, 42 makes use of the principle that the reflectivity of amorphous silicon increases significantly when molten. As such, through the use of equipment, such as spectrophotometers or reflectometers, this change in reflectivity can be used to determine the depth of the source/drain regions 40, 42. A second laser, such as a HeNe laser, can be used to measure the surface reflectivity, or a photo detector can be used to measure the transmitted radiation on the backside of the wafer from the laser used for melting.

Still another known method used to determine junction depth is known as picosecond ultrasonic laser spectroscopy. With this method, a laser creates a low-energy shock or sound wave that travels through the silicon and reflects off of various surfaces, such as the interface between the recrystallized silicon and amorphous silicon. By measuring the reflections of the sound waves, the depth of the source/drain regions 40, 42 can be determined.

Another method for measuring junction depth is known as x-ray reflectivity (XRR). XRR can be used to obtain film thickness as well as interface and surface roughness. Another method is laser multiple-beam optical stress sensing (MOS), which is applicable for measurement of any mechanical stress which is built up in films during growth as well as determining growth rates and variations in thickness. Other techniques for determining junction depth include x-ray fluorescence (XRF), ellipsometry, photoluminescence, modulation spectroscopy, Raman scattering, variable angle spectroscopic ellipsometer (VASE), Fourier transform infrared spectroscopy (FTIR), Rutherford backscattering spectrometry (RBS), and optical scatterometry. An advantage of using the previously-described methods is that the equipment for these processes does not require a vacuum or near vacuum environment in which to operate. As such, the measurement equipment can advantageously be integrated with the laser of the laser thermal annealing process into one piece of equipment.

Figure 4:
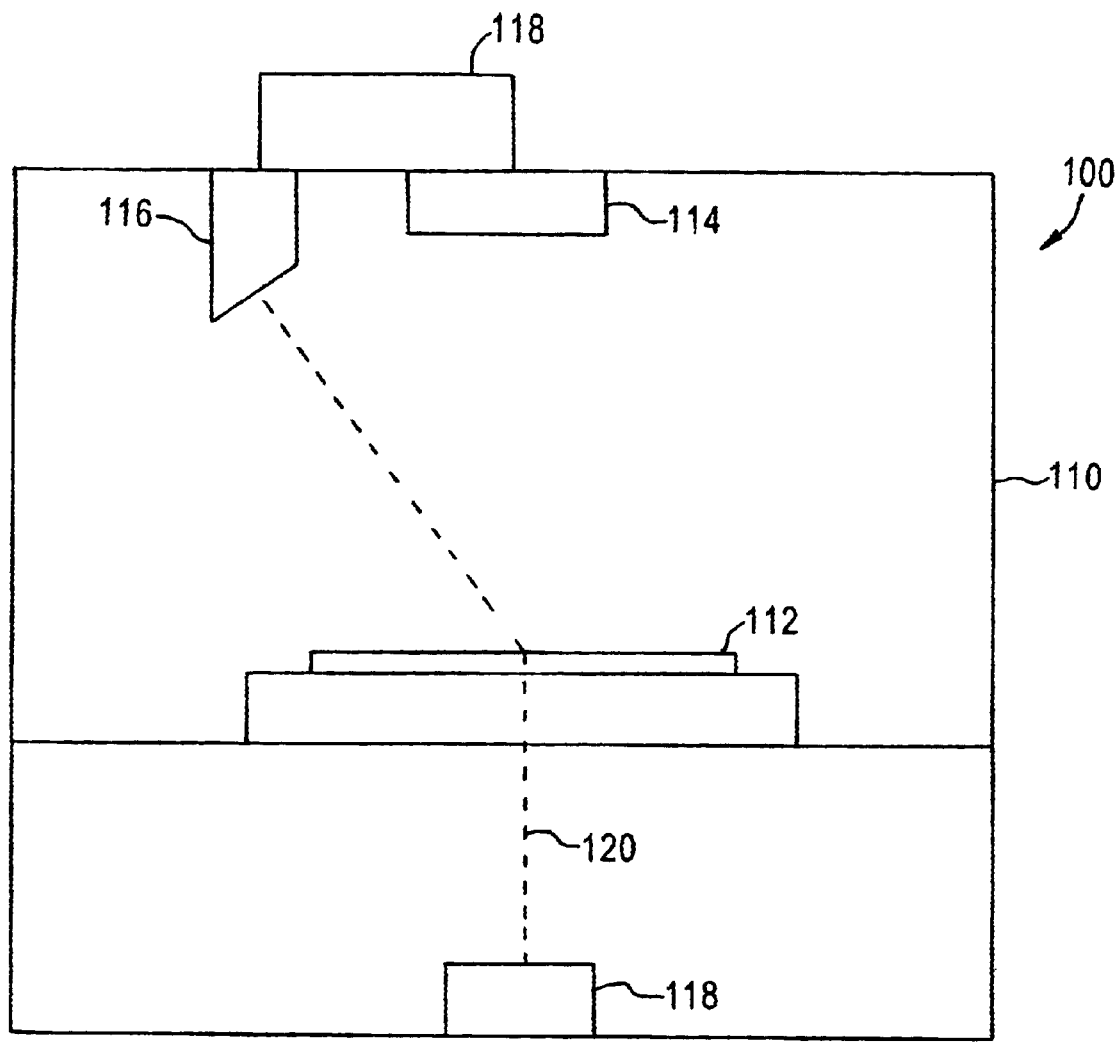
FIG. 4 illustrates a laser thermal annealing and measurement apparatus according to an embodiment of the present invention.
Figure 5:
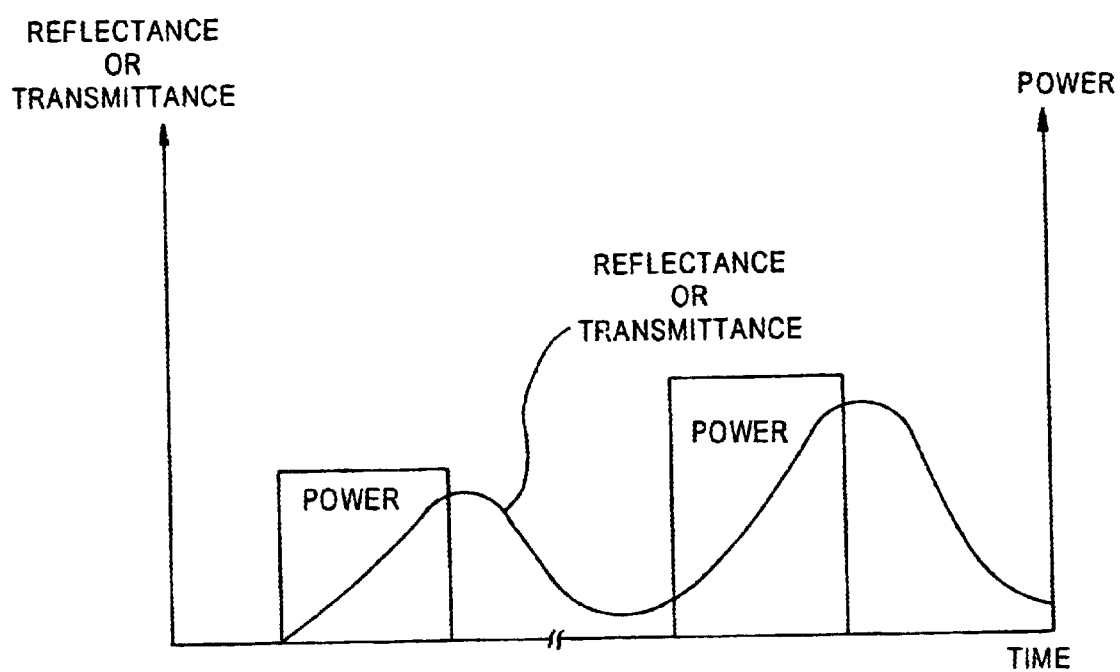
FIG. 5 graphically illustrates the reflectance or transmittance detected by a measurement apparatus during a laser thermal annealing process.

An integrated laser thermal annealing and measurement device 100 is illustrated in FIG. 4. The device 100 includes a chamber 110 in which the semiconductor wafer or device 112 is inserted. The device 100 also includes the laser 114 for laser thermal annealing of the semiconductor device 112 and a measurement device 116 for determining the thickness of the source/drain regions on the semiconductor device 112. The laser 114 and the measurement device 116 can be connected by a controller 118 that adjusts the output of the laser 114 to achieve the desired thickness of the source/drain regions after laser thermal annealing based upon measurements from the measurement device 116. The device 100 can also include a second measurement device 118, such as a second laser or a photo detector, to measure the transmitted radiation 120 from the melt laser 114. As shown in FIG. 5, the measurement device 116 can measure, for example reflectance, or the second measurement device 118 can measure, for example transmittance. Also, these measurements can be made in situ during the laser thermal annealing process.

By combining the measurement device and the laser in one apparatus, the depth of the source/drain regions can be measured immediately after laser thermal annealing, and this measurement can be used to adjust the laser thermal anneal process. Thus, a lower initial fluence can be used during the laser thermal annealing process. In so doing, the likelihood of overmelt of the source/drain regions into the substrate can be reduced. Also, the depth of the source/drain regions can be more finely controlled.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising the steps of:

thermal annealing source/drain regions in the semiconductor device using a laser;

measuring a depth of the source/drain regions after the laser thermal annealing;

adjusting at least one parameter of the laser based upon the measured depth of the source/drain regions; and re-thermal annealing the source/drain regions with the laser having the adjusted at least one parameter.

2. The method of manufacturing a semiconductor device according to claim 1, wherein the at least one parameter adjusted is a wattage of a laser pulse of the laser.

3. The method of manufacturing a semiconductor device according to claim 1, wherein the at least one parameter adjusted is a length of a laser pulse of the laser.

4. The method of manufacturing a semiconductor device according to claim 1, wherein the at least one parameter adjusted is a number of laser pulses of the laser.

5. The method of manufacturing a semiconductor device according to claim 1, further comprising repeating the steps of adjusting the parameter of the laser, measuring the depth of the source/drain regions, and re-thermal annealing the source/drain regions with the laser having the adjusted parameter until a desired depth of the source/drain regions is achieved.

6. The method of manufacturing a semiconductor device according to claim 1, wherein the measuring of the depth of the source/drain regions occurs when the source/drain regions are melted.

7. The method of manufacturing a semiconductor device according to claim 6, wherein the depth measured is a depth of the melted source/drain regions.

8. A method of manufacturing a semiconductor device comprising the steps of:

thermal annealing source/drain regions in the semiconductor device using a laser;

measuring a depth of the source/drain regions after the laser thermal annealing;

adjusting at least one parameter of the laser; and re-thermal annealing the source/drain regions with the laser having the adjusted at least one parameter, wherein the measuring of the depth of the source/drain regions occurs when the source/drain regions are recrystallized.

9. The method of manufacturing a semiconductor device according to claim 8, wherein the depth to be measured is a depth of activated source/drain regions.

10. The method of manufacturing a semiconductor device according to claim 8, wherein the depth to be measured is a depth of the recrystallized source/drain regions.

11. The method of manufacturing a semiconductor device according to claim 1, wherein the measuring step and the annealing step occur in a single chamber of a manufacturing device.

* * * * *